United States Patent
Sanchez et al.

(10) Patent No.: US 10,241,151 B2
(45) Date of Patent: Mar. 26, 2019

(54) DIE CRACK DETECTOR AND METHOD THEREFOR

(71) Applicant: NXP USA, INC., Austin, TX (US)

(72) Inventors: Audel Sanchez, Tempe, AZ (US); Jose Luis Suarez, Chandler, AZ (US); Michele Lynn Miera, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 92 days.

(21) Appl. No.: 15/659,727

(22) Filed: Jul. 26, 2017

(65) Prior Publication Data

US 2019/0033365 A1 Jan. 31, 2019

(51) Int. Cl.
| | |
|---|---|
| *G01R 31/28* | (2006.01) |
| *H01L 49/02* | (2006.01) |
| *H01L 23/522* | (2006.01) |
| *H01L 23/00* | (2006.01) |
| *H01L 23/58* | (2006.01) |
| *G01R 31/02* | (2006.01) |

(52) U.S. Cl.
CPC ....... *G01R 31/2896* (2013.01); *G01R 31/025* (2013.01); *H01L 23/5223* (2013.01); *H01L 23/585* (2013.01); *H01L 24/48* (2013.01); *H01L 28/40* (2013.01); *H01L 2224/4823* (2013.01); *H01L 2224/48227* (2013.01); *H01L 2924/1205* (2013.01)

(58) Field of Classification Search
CPC .............. G01R 31/2896; G01R 31/025; H01L 23/5223; H01L 23/585; H01L 24/48; H01L 28/40; H01L 2224/48227; H01L 2224/4823; H01L 2924/1205
USPC ..................................... 324/762.03
See application file for complete search history.

(56) References Cited

U.S. PATENT DOCUMENTS

| | | | |
|---|---|---|---|
| 7,649,200 B1 | 1/2010 | Miller et al. | |
| 8,253,420 B2 | 8/2012 | Nickel et al. | |
| 8,310,066 B2* | 11/2012 | Sasaki | H01L 23/585 257/777 |
| 9,070,683 B2 | 6/2015 | Fender et al. | |
| 2010/0001405 A1* | 1/2010 | Williamson | H01L 23/585 257/774 |
| 2011/0133747 A1 | 6/2011 | Nickel et al. | |
| 2015/0008431 A1 | 1/2015 | Veches | |
| 2015/0048373 A1 | 2/2015 | Veches | |
| 2015/0115266 A1 | 4/2015 | Sanchez et al. | |
| 2015/0170979 A1 | 6/2015 | Dennison et al. | |
| 2016/0197056 A1 | 7/2016 | Bhowmik et al. | |
| 2018/0145002 A1* | 5/2018 | Munder | G01R 31/2858 |

* cited by examiner

*Primary Examiner* — Melissa J Koval
*Assistant Examiner* — Rahul Maini

(57) ABSTRACT

A die crack detector and method are provided. A first metal trace is formed over a substrate with the first metal trace configured to extend around a perimeter of a semiconductor die. A second metal trace is formed over the first metal trace with the second metal trace configured to overlap the first metal trace. A dielectric material is disposed between the first and second metal traces. A first detector terminal is coupled to the first metal trace and a second detector terminal coupled to the second metal trace. The detector terminals are configured to receive a predetermined voltage.

20 Claims, 4 Drawing Sheets

DIE CRACK DETECTOR AND METHOD THEREFOR

BACKGROUND

Field

This disclosure relates generally to semiconductor devices, and more specifically, to detecting cracks in semiconductor devices.

Related Art

Integrated circuits (ICs) are generally formed on a semiconductor wafer. The semiconductor wafer is subsequently sawn or cut into separate individual die with each die including an IC. These IC die may then be encased in a package, and configured to include electrical connections with corresponding leads on the package. Electrical connections between the IC die and a printed circuit board are generally formed by way of connectivity with the package leads. With the advancement of semiconductor processes and packaging techniques, there is a heightened focus on manufacturing costs. However, challenges remain in achieving improved quality, yield, and reliability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a die crack detector including a metal-insulator-metal (MIM) capacitor structure arranged to substantially extend around a perimeter of a semiconductor die. Overlapping metal traces separated by a dielectric material are formed over the substrate of the semiconductor die to form the MIM capacitor structure. The MIM capacitor structure is configured to form a contiguous ring around the perimeter of the semiconductor die, enclosing functional circuitry. By applying a predetermined voltage across the MIM capacitor structure, a measured current can be used to detect a die crack which ingresses into the MIM capacitor structure.

One issue in the fabrication and packaging of ICs is the presence of cracks on the die. Cracks can form on die with a variety of structures, including fissures, fractures and/or other dislocation. Furthermore, relatively small cracks can enlarge during subsequent processing, stress, or use. For example, cracks can form or enlarge during fabrication, sawing, packaging, and/or installation into the end devices. In such cases, such cracks can lead to failure of one or more devices on the IC. For example, die cracks can lead to current leakage in the die that may interfere with the operation of passive and/or active components on the IC.

Die cracks can be particularly problematic on modern ICs with relatively high device densities and relatively high heat generation. Furthermore, as die become smaller and thinner they can become more susceptible to cracking, with the potential of resulting failures. Furthermore, because die cracks can enlarge during subsequent environmental or physical events, it is important to detect cracks that are currently too small to affect operation now but may enlarge in the future. For example, die cracks that are relatively small after packaging can enlarge when heated and installed into the end device by a customer. Thus, it is important to detect such relatively small cracks even if those cracks are not currently causing electrical or functional failures. Specifically, it is important to detect such relatively small cracks before the packaged IC is shipped to a customer and/or installed on the end use device. However, some techniques have proven to be ineffective for detecting die cracks that are in infant stages or considerably small.

Figure 1:
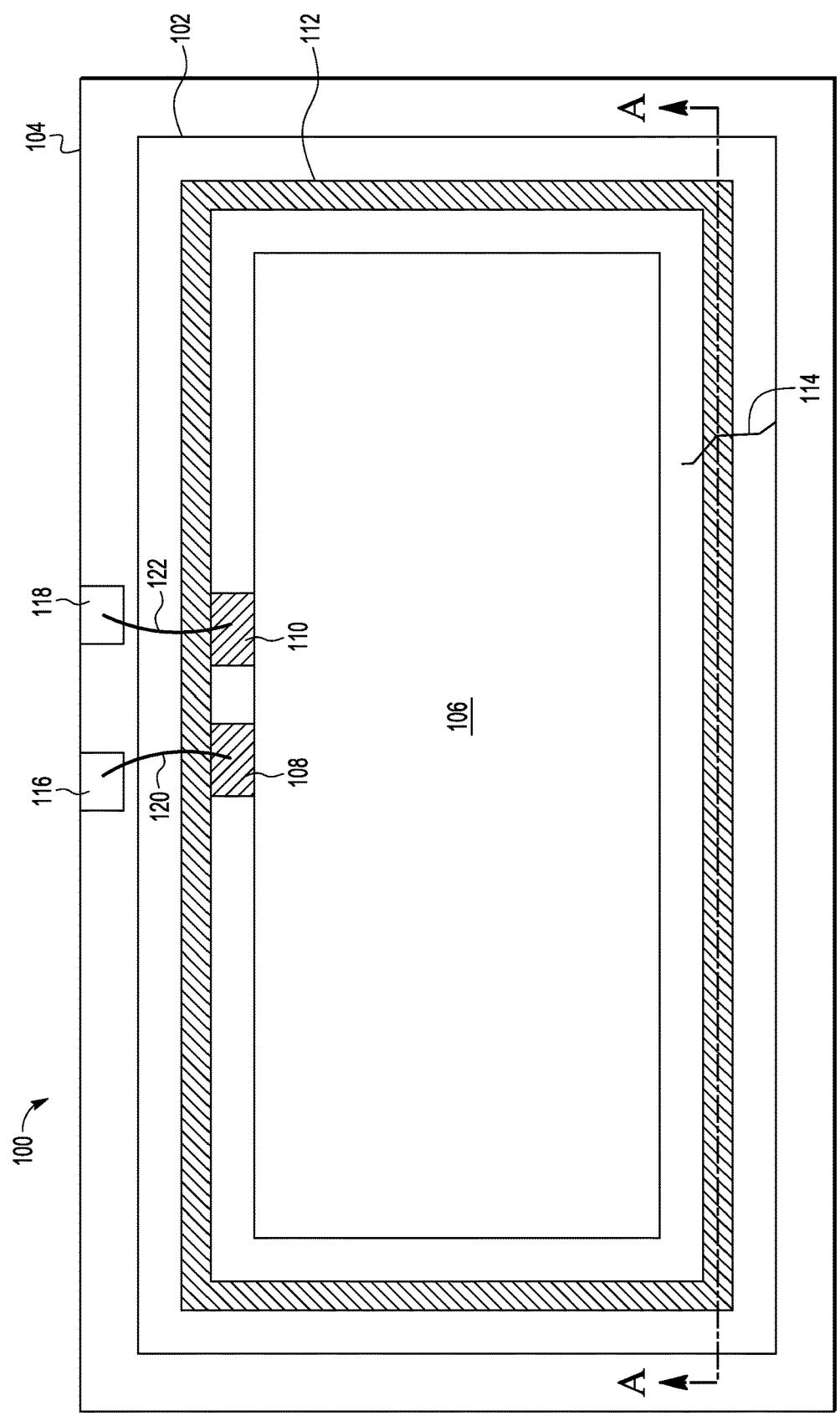
FIG. 1 illustrates, in a plan view, an exemplary die crack detector structure in accordance with an embodiment of the present invention.

FIG. 1 illustrates, in a plan view, an exemplary die crack detector 100 in accordance with an embodiment of the present invention. Die crack detector 100 includes a first metal trace (not shown) formed on semiconductor die 102, second metal trace 112 formed over the first metal trace, and a dielectric layer (not shown) disposed between the first metal trace and the second metal trace 112. A first terminal 108 is connected to the first metal trace, and a second terminal 110 is connected to the second metal trace 112. Semiconductor die 102 includes functional circuit 106 substantially enclosed by the first and second metal traces. Semiconductor die 102 in mounted in package 104. Package 104 includes package leads 116 and 118, and bonding wires 120 and 122 provide electrical connectivity between the semiconductor die 102 and package leads 116 and 118. In the embodiment depicted in FIG. 1, die crack 114 is shown for illustrative purposes.

First metal trace (not shown) and overlaying second metal trace 112 are formed over the substrate of semiconductor die 102 and arranged to substantially extend around a perimeter of semiconductor die 102. As arranged, a structure formed by the first and second metal traces can be used to detect a crack on the semiconductor die 102. First and second metal traces may be configured to form contiguous overlapping rings around the perimeter of the semiconductor die 102 having a contiguous ring of the second metal trace 112 overlaying a contiguous ring of the first metal trace. The first metal trace may be formed from a first interconnect layer of the semiconductor die 102 and the second metal trace 112 may be formed from a second interconnect layer of the semiconductor die 102. The first metal trace is connected to terminal 108 and second metal trace 112 is connected to terminal 110. Terminals 108 and 110 may be formed from the same metallization layers as first and second metal traces, respectively. In some embodiments, terminals 108 and 110 may be formed to be contactable during wafer level testing. In some embodiments, terminals 108 and 110 may be formed to be connected to package leads 116 and 118 by way of bonding wires 120 and 122 respectively. In some embodiments, terminals 108 and 110 may be connected to the functional circuit 106. For example, terminal 108 may be connected to a ground voltage supply at functional circuit 106, and terminal 110 may be contacted during wafer level testing and subsequently wire bonded to package lead 118 for assembled product level testing.

As described above, the first and second metal traces are arranged to at least substantially extend around a perimeter of semiconductor die 102. The greater portion of the perimeter that the first and second metal traces extend around, the greater the detection ability provided by the structure formed by first and second metal traces. Accordingly, it is generally desirable to have first and second metal traces extend around at least about 80% of the perimeter, although in other embodiments, the percentage of perimeter traversed by the first and second metal traces may be more or less.

In some embodiments, the first and second metal traces are formed proximate to a die seal ring structure (not shown) at the perimeter edges of semiconductor die 102. In general, die seal ring structures are formed to prevent die sawing stresses from affecting the elements in the interior of the semiconductor die 102. For this reason, die seal ring structures are typically formed to extend around the perimeter of semiconductor die 102. Forming the first and second metal traces proximate to the seal ring structure thus provides the ability to detect cracks near the edge of the die.

Functional circuit 106 may include any or combination of digital circuits, analog circuits, memories, processors, passive elements such as resistors, capacitors, inductors, microelectromechanical systems (MEMS), laterally diffused MOSFETs (LDMOS), sensors, and the like. Semiconductor die including such functional circuitry may be characterized as RF devices, integrated passive devices (IPD), LDMOS devices, and the like. Functional circuit 106 may be connected to terminals 108 and 110 by way of test circuitry (not shown).

Figure 2:
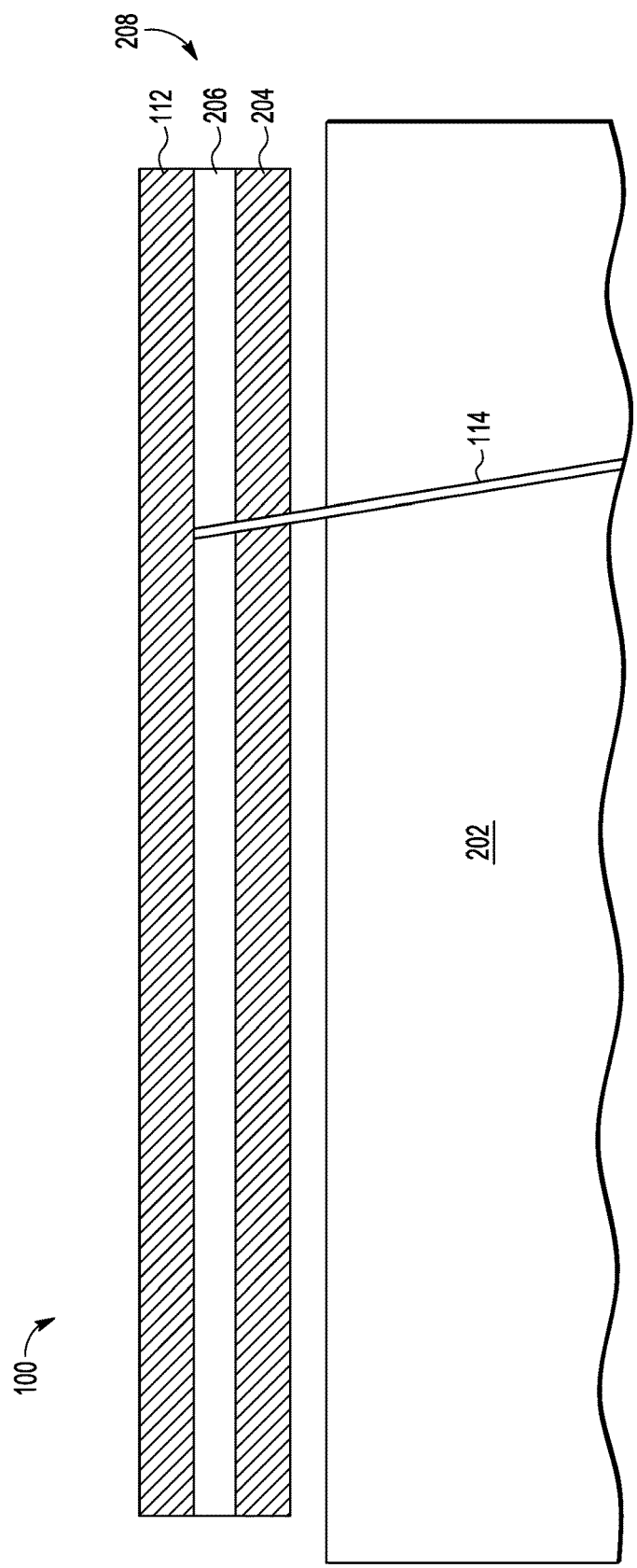
FIG. 2 illustrates, in a cross-sectional view, exemplary die crack detector structure in accordance with an embodiment of the present invention.

FIG. 2 illustrates, in a cross-sectional view of semiconductor die 102 taken along cut line A-A, exemplary die crack detector 100 in accordance with an embodiment of the present invention. As depicted in FIG. 2, semiconductor die 102 includes substrate 202, first metal trace 204 formed over substrate 202, second metal trace 112 formed over first metal trace 204, and dielectric layer 206 disposed between the first and second metal traces 204 and 112. In some embodiments, the first metal trace 204 may be formed in substrate 202. The arrangement of first metal trace 204, dielectric layer 206, and second metal trace 112 forms a metal-insulator-metal (MIM) capacitor structure 208. In the embodiment depicted in FIG. 2, a cross-sectional view of die crack 114 is shown for illustrative purposes.

Substrate 202 may be formed from any suitable substrate material, such as silicon, germanium, gallium arsenide, gallium nitride, silicon-on-insulator (SOI), silicon-on-sapphire (SOS), silicon germanium-on-insulator (SGOI), and the like. Substrate 202 may be formed to have a thickness of 5 mils or less. In this embodiment, substrate 202 is formed from a gallium arsenide material and has a thickness in the range of 1-3 mils, for example.

The MIM capacitor structure 208 of the die crack detector 100 is formed by the arrangement of the second metal trace 112 overlapping the first metal trace 204, having dielectric layer 206 disposed between the first and second metal traces. The first metal trace 204 may be characterized as a bottom plate of the MIM capacitor structure 208, and the second metal trace 112 may be characterized as a top plate of the MIM capacitor structure 208. The top and bottom plates of the MIM capacitor structure 208 are separated by dielectric layer 206. The MIM capacitor structure 208 may be formed from any two different metal layers separated by one or more dielectric layers. The first and second metal traces 204 and 112 of the MIM capacitor structure 208 may be formed from a variety of electrically conductive materials, such as copper (Cu), gold (Au), silver (Ag), aluminum (Al), nickel (Ni), tungsten (W), and the like, and alloys thereof. The first metal trace 204 may be formed from a conductive material different from the second metal trace 112. The dielectric layer 206 may be formed from a wide range of materials used for interlayer dielectrics, such as silicon dioxide, silicon nitride, silicon oxy-nitride, and the like, or any combination of such layers providing electrical isolation. In this embodiment, first and second metal traces include a gold material, and dielectric layer 206 includes a silicon nitride material, for example.

Semiconductor die 102 may further include dielectric, metal, or semi-conductive layers or combinations thereof (not shown) disposed between the MIM capacitor structure 208 and the substrate 202, and/or formed over the MIM capacitor structure 208. For example, an insulating layer may be formed between the MIM capacitor structure 208 and the substrate 202, and a passivation layer may be formed over the MIM capacitor structure 208.

Die crack 114, as depicted in FIG. 2, is illustrated as a crack which may have resulted from stress, manufacturing process, or the like. Such cracks may begin at an edge of a die like semiconductor die 102 and propagate inward. Die crack 114 is shown as a crack which ingresses into the MIM capacitor structure 208. Die crack 114 is depicted as a very narrow air gap formed between the portions of the semiconductor die 102 separated by the crack. Because such cracks as die crack 114 ingress into the MIM capacitor structure 208, cracks can be detected by testing the integrity of the MIM capacitor structure 208.

Figure 3:
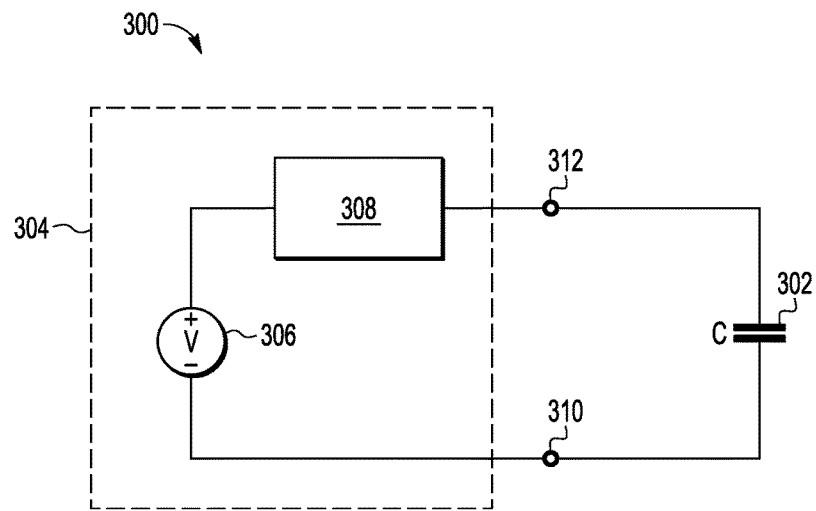
FIG. 3 illustrates, in schematic diagram form, an exemplary die crack detector circuit in accordance with an embodiment of the present invention.

FIG. 3 illustrates, in schematic diagram form, an exemplary die crack detector circuit 300 in accordance with an embodiment of the present invention. Die crack detector circuit 300 includes test circuitry 304 connected to die crack detector capacitor 302 at terminals 310 and 312. Capacitor 302 is representative of MIM capacitor structure 208 depicted in FIG. 2, and terminals 310 and 312 are representative of terminals 108 and 110 depicted in FIG. 1, respectively. Test circuitry 304 includes a voltage source 306 and current measurement device 308. Test circuitry 304 may be included in factory automated test equipment (ATE) such as ATE used for wafer level testing and assembled product level testing, for example. In some embodiments, test circuitry 304 may be included in functional circuit 106 as part of a built-in self-test (BIST) scheme.

Capacitor 302 is representative of MIM capacitor structure 208 formed by the stacked combination of first metal trace 204, dielectric layer 206, and second metal trace 112, and arranged to substantially extend around a perimeter of semiconductor die 102. Terminals 310 and 312 are representative of terminals 108 and 110 connected to first and second metal traces 204 and 112, respectively.

Test circuitry 304 is connected to capacitor 302 at first and second terminals 310 and 312. Test circuitry includes voltage supply 306 and current measurement device 308. Test circuitry 304 may include other sources and other measurement devices. In this embodiment, a first terminal (−) of voltage supply 306 is connected to first terminal 310 of capacitor 302, and a second terminal (+) of voltage supply 306 is connected to a first terminal of current measurement device 308. A second terminal of current measurement device 308 is connected to second terminal 312 of capacitor 302. In this embodiment, voltage supply 306 is connected in series with current measurement device 308. In some embodiments, the first terminal (−) of voltage supply 306 may be characterized as a ground voltage terminal. In some embodiments, the first terminal 310 may be connected to a ground voltage supply terminal on semiconductor die 102.

In operation, voltage supply 306 of test circuitry 304 may apply a voltage at terminal 312 having a value lower than a breakdown voltage of capacitor 302, and voltage source 306 may apply a ground voltage at terminal 310. In some embodiments, the first and second terminal connections may be swapped such that a voltage applied at terminal 310 may have a value lower than a breakdown voltage of capacitor 302, and a ground voltage may be applied at terminal 312. For example, to test the integrity of the die crack detector capacitor 302, voltage supply 306 provides a predetermined test voltage across terminals 310 and 312 of capacitor 302. The predetermined test voltage applies a voltage stress on the capacitor 302 such that a significant leaking current would result if a die crack affected the capacitor 302.

Figure 4:
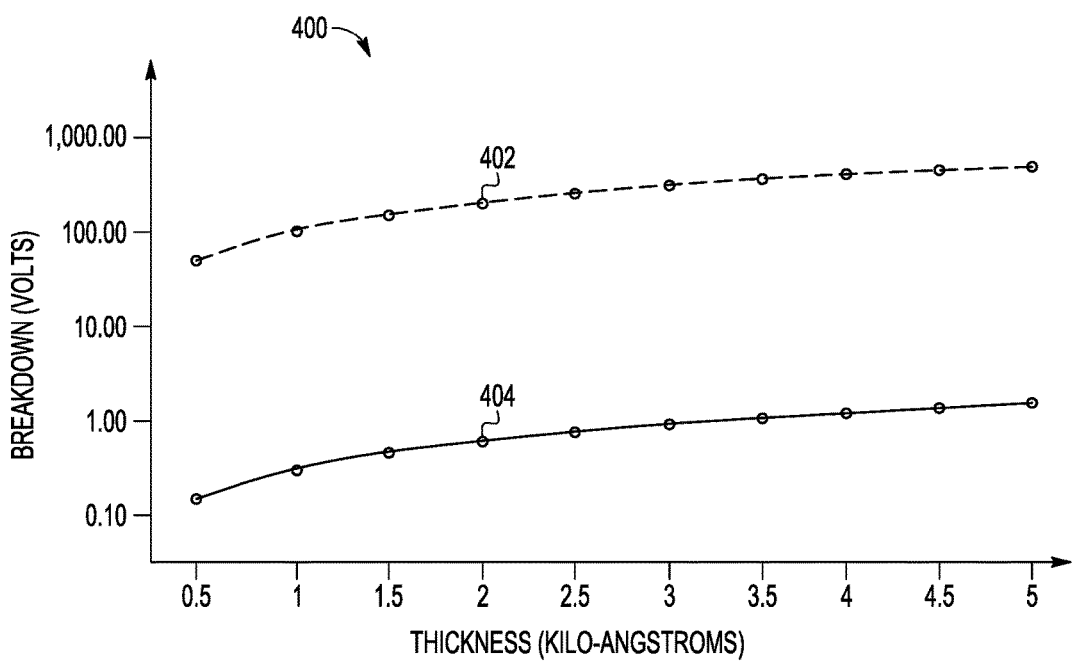
FIG. 4 illustrates, in a graphical view, exemplary breakdown voltage versus dielectric thickness chart in accordance with an embodiment of the present invention.

FIG. 4 illustrates, in a graphical view, an exemplary breakdown voltage versus dielectric thickness chart in accordance with an embodiment of the present invention. Shown are dielectric breakdown voltages versus dielectric thickness. Thickness values are shown in kilo-angstroms (KÅ) on the X-axis, and breakdown voltage values are shown in volts (V) on the Y-axis. FIG. 4 includes a first waveform 402 depicting breakdown voltage versus thickness for silicon nitride (SiN), and a second waveform 404 depicting breakdown voltage versus thickness for air. Here, the SiN waveform 402 shows superior breakdown voltage characteristics when compared with the air waveform 404. For example, at a thickness of 2 KÅ, a breakdown voltage for the SiN dielectric material is greater than 100 volts while a breakdown voltage for the air dielectric is less than 1.0 volt. Thus, a crack which causes fissures, fractures and/or separation in the dielectric layer 206 of the capacitor structure 208 would have a lower breakdown voltage and exhibit higher leakage current when tested with an appropriate test voltage. An appropriate test voltage may be a predetermined voltage that is lower than a breakdown voltage of the dielectric layer 206, yet high enough to measure a significant amount of leakage current when a crack is present. For example, in this embodiment, dielectric layer 206 is formed from a SiN material, having a thickness of approximately 2 KÅ, and voltage supply 306 provides a predetermined test voltage of approximately 65 volts across terminals 310 and 312 of capacitor 302.

Figure 5:
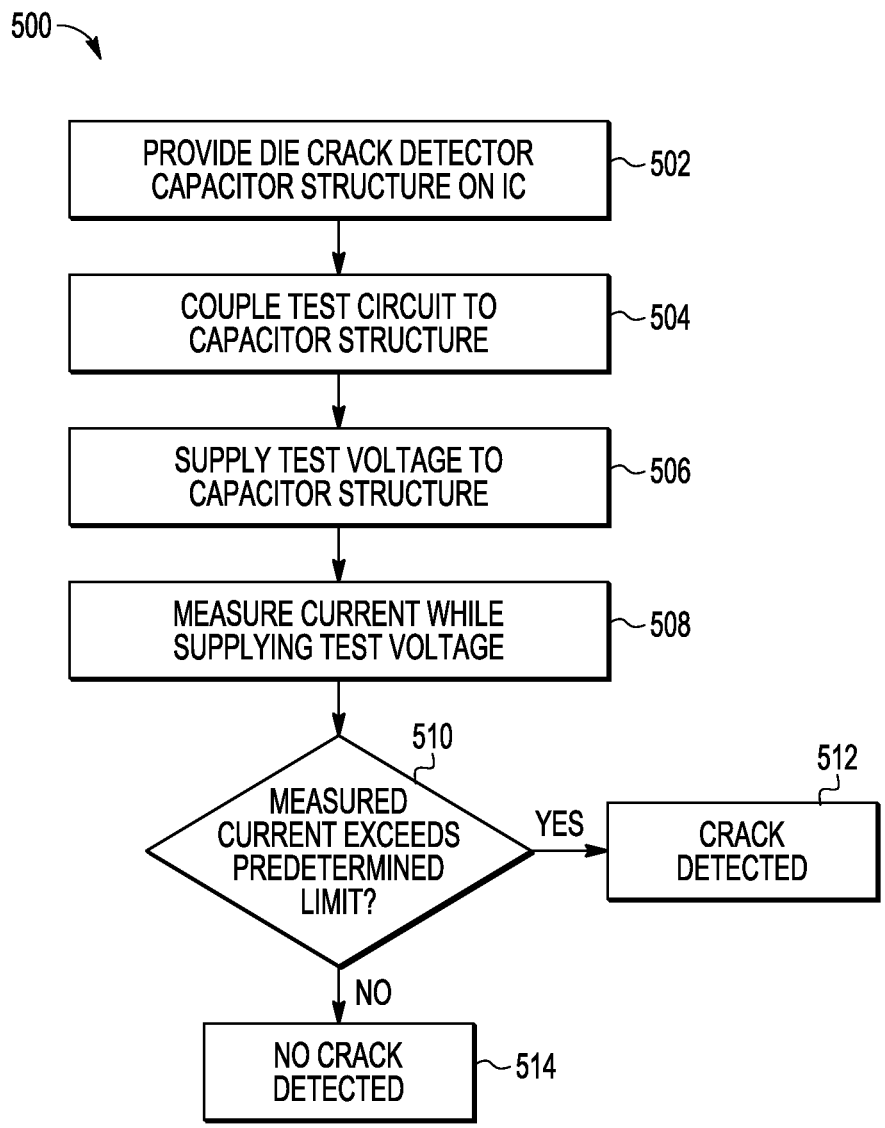
FIG. 5 illustrates, in flow diagram form, exemplary method for die crack detection in accordance with an embodiment of the present invention.

FIG. 5 illustrates, in flow-chart diagram form, exemplary method for die crack detection in accordance with an embodiment of the present invention. In operation, test circuitry 304 is connected to capacitor 302 as depicted in FIG. 3. Because the test circuitry includes voltage source 306 and current measurement device 308, leakage measurements can be performed while a predetermined test voltage is applied to capacitor 302. Based on the leakage measurements, a die crack may be determined.

At step 502, provide a die crack detector capacitor structure on an integrated circuit (IC). The MIM capacitor structure 208 corresponding to capacitor 302 is provided on a substrate 202 of an IC, where first and second metal traces 204 and 112 forming the MIM capacitor are configured to substantially extend around a perimeter of IC die.

At step 504, couple test circuit to the die crack detector capacitor structure. Test circuitry 304 is connected to capacitor 302 by way of terminals 310 and 312. The test circuitry 304 includes voltage supply 306 and current measurement device 308. Test circuitry 304 may be included in factory automated test equipment (ATE). For example, such ATE may be used in probe testing of ICs while in wafer form where terminals 310 and 312 are formed as probe pads. Such ATE may also be used in assembled product testing where terminals 310 and 312 are bonded to package leads, for example. In some embodiments, test circuitry 304 may be included in functional circuit 106 as part of a built-in self-test (BIST) scheme.

At step 506, supply a test voltage to the die crack detector capacitor structure. Voltage supply 306 supplies a predetermined test voltage to capacitor 302 during a test mode. The predetermined voltage may be a voltage less than a breakdown voltage of the dielectric layer 206 of the MIM capacitor structure 208. The predetermined voltage may be a voltage sufficient to cause measurable leakage current in a MIM capacitor structure affected by a die crack. The predetermined voltage may be applied as a voltage differential across the first and second metal traces 204 and 112 of the MIM capacitor structure 208.

At step 508, measure current while supplying the test voltage. During the test mode, current measurement device 308 monitors leakage current while the predetermined voltage is supplied to capacitor 302.

At step 510, determine if measured leakage current exceeds a predetermined limit. When testing a good die, one that does not have a die crack, very little leakage current will be measured while the predetermined voltage is applied. In contrast, when testing a bad die, one that has a die crack, a higher leakage current will be measured. Therefore, a predetermined current value is set as a limit. For example, a predetermined current limit may be set at 100 picoamps while a predetermined voltage such as 65 volts is applied to the MIM capacitor structure 208. A current measurement exceeding this limit may be an indication that a die crack exists. The predetermined current limit may be determined by empirical data or theoretical values based on the predetermined voltage and dielectric material composition. If the measured leakage current exceeds the limit value (YES), then a die crack is detected at step 512. If the measured leakage current is equal to or less than the limit value, then no die crack is detected at step 514.

Generally, there is provided, a die crack detector including a first metal trace formed over a substrate, the first metal trace configured to substantially extend around a perimeter of a semiconductor die; a second metal trace formed over the first metal trace, the second metal trace configured to at least substantially overlap the first metal trace; a dielectric material disposed between the first metal trace and the second metal trace; a first detector terminal coupled to the first metal trace, the first detector terminal configured to receive a first power supply voltage; and a second detector terminal coupled to the second metal trace, the second detector terminal configure to receive a second power supply voltage. The first metal trace may be configured to form a first contiguous ring around the perimeter of the semiconductor die, and the second metal trace may be configured to form a second contiguous ring overlapping the first contiguous ring, the first and second contiguous rings enclosing functional circuitry. The second terminal may be coupled to a package pin to receive the second power supply voltage. The dielectric material may be characterized as a silicon nitride (SiN) material. The first metal trace, dielectric material, and second metal trace may form a metal-insulator-metal (MIM) capacitor. The second power supply voltage may be a predetermined voltage, the predetermined voltage lower than a breakdown voltage of the MIM capacitor. The die crack detector may further include a first power supply having a first terminal coupled to provide a ground voltage at the first detector terminal and a second terminal coupled to provide the predetermined voltage at the second detector terminal. The die crack detector may further include a current measuring device coupled to the first power supply, the current measuring device configured to measure a leakage current while the predetermined voltage is provided at the second detector terminal. The second terminal may be coupled to provide the predetermined voltage at the second detector terminal and current measuring device may be configured to measure a leakage current during a test mode.

In another embodiment, there is provided, a die crack detector including a metal-insulator-metal (MIM) capacitor structure including a first metal trace formed over a substrate, the first metal trace arranged to at least substantially extend around a perimeter of a semiconductor die, a second metal trace formed over the first metal trace, the second metal trace arranged to at least substantially overlap the first metal trace, and a dielectric material disposed between the first metal trace and the second metal trace; a first detector terminal coupled to the first metal trace, the first detector terminal configured to receive a first power supply voltage; and a second detector terminal coupled to the second metal trace, the second detector terminal configure to receive a second power supply voltage. The first metal trace may be arranged to form a first contiguous ring around the perimeter of the semiconductor die, and wherein the second metal trace may be arranged to form a second contiguous ring overlapping the first contiguous ring. The second terminal may be coupled to a package pin to receive the second power supply voltage. The dielectric material may be characterized as a silicon nitride (SiN) material. The semiconductor die may be characterized as an integrated passive device (IPD). The first metal trace may be formed from a first interconnect layer of the semiconductor die, and wherein the second metal trace may be formed from a second interconnect layer of the semiconductor die. The semiconductor die may have a thickness of 3 mils or less. The die crack detector may further include a test circuit coupled to the MIM capacitor structure by way of the first and second detector terminals, the test circuit to provide a predetermined test voltage and measure leakage current during a test mode.

In yet another embodiment, there is provided, a method including providing a metal-insulator-metal (MIM) capacitor structure on a semiconductor die, the MIM capacitor structure including a first metal trace formed over a substrate of the semiconductor die, the first metal trace arranged to at least substantially extend around a perimeter of the semiconductor die, a second metal trace formed over the first metal trace, the second metal trace arranged to at least substantially overlap the first metal trace, and a dielectric material disposed between the first metal trace and the second metal trace; coupling a test circuit to the first and second metal traces of the MIM capacitor structure; applying a predetermined test voltage differential across the first and second metal traces of the MIM capacitor structure; and measuring a leakage current of the MIM capacitor structure while the predetermined test voltage is applied. The method may further include determining that the semiconductor die is cracked based on the leakage current exceeding a predetermined test limit. Applying the predetermined test voltage and measuring the leakage current may be performed by way of the test circuit during a test mode.

By now it should be appreciated that there has been provided, a die crack detector including a metal-insulator-metal (MIM) capacitor structure arranged to substantially extend around a perimeter of a semiconductor die. Overlapping metal traces separated by a dielectric material are formed over the substrate of the semiconductor die to form the MIM capacitor structure. The MIM capacitor structure is configured to form a contiguous ring around the perimeter of the semiconductor die, enclosing functional circuitry. By applying a predetermined voltage across the MIM capacitor structure, a measured current can be used to detect a die crack which ingresses into the MIM capacitor structure.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

As used herein, the term "exemplary" refers to "serving as an example, instance, or illustration." Any implementation described herein as exemplary is not necessarily to be construed as preferred or advantageous over other implementations.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A die crack detector comprising:
    a first metal trace formed over a substrate, the first metal trace configured to substantially extend around a perimeter of a semiconductor die;
    a second metal trace formed over the first metal trace, the second metal trace configured to at least substantially overlap the first metal trace;
    a dielectric material disposed between the first metal trace and the second metal trace;

a first detector terminal coupled to the first metal trace, the first detector terminal configured to receive a first power supply voltage; and a second detector terminal coupled to the second metal trace, the second detector terminal configured to receive a second power supply voltage.

2. The die crack detector of claim 1, wherein the first metal trace is configured to form a first contiguous ring around the perimeter of the semiconductor die, and wherein the second metal trace is configured to form a second contiguous ring overlapping the first contiguous ring, the first and second contiguous rings enclosing functional circuitry.

3. The die crack detector of claim 1, wherein the second terminal is coupled to a package pin to receive the second power supply voltage.

4. The die crack detector of claim 1, wherein the dielectric material is characterized as a silicon nitride (SiN) material.

5. The die crack detector of claim 1, wherein the first metal trace, the dielectric material, and the second metal trace form a metal-insulator-metal (MIM) capacitor.

6. The die crack detector of claim 5, wherein the second power supply voltage is a predetermined voltage, the predetermined voltage lower than a breakdown voltage of the MIM capacitor.

7. The die crack detector of claim 6, further comprising a first power supply having a first terminal coupled to provide a ground voltage at the first detector terminal and a second terminal coupled to provide the predetermined voltage at the second detector terminal.

8. The die crack detector of claim 7, further comprising a current measuring device coupled to the first power supply, the current measuring device configured to measure a leakage current while the predetermined voltage is provided at the second detector terminal.

9. The die crack detector of claim 8, wherein the second terminal is coupled to provide the predetermined voltage at the second detector terminal and the current measuring device is configured to measure the leakage current during a test mode.

10. A die crack detector comprising:
a metal-insulator-metal (MIM) capacitor structure comprising:
a first metal trace formed over a substrate, the first metal trace arranged to at least substantially extend around a perimeter of a semiconductor die,
a second metal trace formed over the first metal trace, the second metal trace arranged to at least substantially overlap the first metal trace, and
a dielectric material disposed between the first metal trace and the second metal trace;
a first detector terminal coupled to the first metal trace, the first detector terminal configured to receive a first power supply voltage; and
a second detector terminal coupled to the second metal trace, the second detector terminal configure to receive a second power supply voltage.

11. The die crack detector of claim 10, wherein the first metal trace is arranged to form a first contiguous ring around the perimeter of the semiconductor die, and wherein the second metal trace is arranged to form a second contiguous ring overlapping the first contiguous ring.

12. The die crack detector of claim 10, wherein the second terminal is coupled to a package pin to receive the second power supply voltage.

13. The die crack detector of claim 10, wherein the dielectric material is characterized as a silicon nitride (SiN) material.

14. The die crack detector of claim 10, wherein the semiconductor die is characterized as an integrated passive device (IPD).

15. The die crack detector of claim 10, wherein the first metal trace is formed from a first interconnect layer of the semiconductor die, and wherein the second metal trace is formed from a second interconnect layer of the semiconductor die.

16. The die crack detector of claim 10, wherein the semiconductor die has a thickness of 3 mils or less.

17. The die crack detector of claim 10, further comprising a test circuit coupled to the MIM capacitor structure by way of the first and second detector terminals, the test circuit to provide a predetermined test voltage and measure leakage current during a test mode.

18. A method comprising:
providing a metal-insulator-metal (MIM) capacitor structure on a semiconductor die, the MIM capacitor structure comprising:
a first metal trace formed over a substrate of the semiconductor die, the first metal trace arranged to at least substantially extend around a perimeter of the semiconductor die,
a second metal trace formed over the first metal trace, the second metal trace arranged to at least substantially overlap the first metal trace, and
a dielectric material disposed between the first metal trace and the second metal trace;
coupling a test circuit to the first and second metal traces of the MIM capacitor structure;
applying a predetermined test voltage differential across the first and second metal traces of the MIM capacitor structure; and
measuring a leakage current of the MIM capacitor structure while the predetermined test voltage is applied.

19. The method of claim 18, further comprising determining that the semiconductor die is cracked based on the leakage current exceeding a predetermined test limit.

20. The method of claim 18, wherein applying the predetermined test voltage and measuring the leakage current are performed by way of the test circuit during a test mode.

* * * * *